(12) United States Patent
Totani

(10) Patent No.: US 9,385,273 B2
(45) Date of Patent: Jul. 5, 2016

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/754,248

(22) Filed: Jun. 29, 2015

(65) Prior Publication Data

US 2016/0020357 A1 Jan. 21, 2016

(30) Foreign Application Priority Data

Jul. 15, 2014 (JP) .................................. 2014-145455

(51) Int. Cl.
  H01L 33/00 (2010.01)
  H01L 33/14 (2010.01)
  H01L 33/32 (2010.01)
  H01L 33/10 (2010.01)
  H01L 33/42 (2010.01)

(52) U.S. Cl.
  CPC .......... *H01L 33/145* (2013.01); *H01L 33/0075* (2013.01); *H01L 33/10* (2013.01); *H01L 33/32* (2013.01); *H01L 33/42* (2013.01); *H01L 2933/0016* (2013.01); *H01L 2933/0025* (2013.01)

(58) Field of Classification Search
  CPC ....... H01L 33/145; H01L 33/10; H01L 33/42; H01L 33/32; H01L 33/0075; H01L 2933/0016; H01L 2933/0025
  See application file for complete search history.

(56) References Cited

U.S. PATENT DOCUMENTS

| 7,863,599 B2 * | 1/2011 | Kim ...................... H01L 33/465 257/13 |
| 2006/0054921 A1 * | 3/2006 | Murakami .............. H01L 33/42 257/103 |
| 2008/0164486 A1 * | 7/2008 | Hosomi .............. H01L 33/0079 257/94 |
| 2013/0292731 A1 * | 11/2013 | Chen ...................... H01L 33/22 257/98 |
| 2015/0236216 A1 * | 8/2015 | Kim ........................ H01L 33/46 257/98 |

FOREIGN PATENT DOCUMENTS

| JP | 2007-150310 A | 6/2007 |
| JP | 2008-192710 A | 8/2008 |

* cited by examiner

*Primary Examiner* — Victor A Mandala
(74) *Attorney, Agent, or Firm* — McGinn IP Law Group, PLLC

(57) ABSTRACT

The Group III nitride semiconductor light-emitting device has an insulating multilayer film intervening between a second semiconductor layer and a transparent electrode. The insulating multilayer film serves as a distributed Bragg reflector and is formed in a region including a projection area obtained by projecting a p-electrode to the p-type contact layer. The insulating multilayer film has a first region and a second region, wherein the first region has a layer thickness greater than 95% of the maximum film thickness of the insulating multilayer film, and the second region has a layer thickness not greater than 95% of the maximum film thickness of the insulating multilayer film. The second surface of the insulating multilayer film in the second region has a slope having a dent portion denting toward the first surface of the insulating film.

19 Claims, 7 Drawing Sheets

GROUP III NITRIDE SEMICONDUCTOR LIGHT-EMITTING DEVICE AND PRODUCTION METHOD THEREFOR

BACKGROUND OF THE INVENTION

1. Field of the Invention

The present techniques relate to a Group III nitride semiconductor light-emitting device and to a method for producing the device. More particularly, the techniques relate to a Group III nitride semiconductor light-emitting device having a current-blocking layer and to a method for producing the device.

2. Background Art

In a Group III nitride semiconductor light-emitting device, current tends to flow a region directly under the p-electrode, while current flow is impeded in a region away from the p-electrode. Due to the localization of current flow, the overall emission efficiency of the light-emitting device may be suppressed.

In one solution for preventing such localization of current flow, a current-blocking layer is placed directly under the p-electrode. For example, Patent Document 1 discloses a technique in which a transparent insulating film is formed as a current-blocking layer (see, for example, paragraphs [0017] and [0018], and FIG. 1 of Patent Document 1). By virtue of the current-blocking layer, light emission can be caused to occur selectively in a light-emitting layer (see, for example, paragraph [0004] of Patent Document 1).

Patent Document 2 discloses a light-emitting device of a laser lift-off type. In the light-emitting device, a current-blocking layer is disposed between the p-type GaN layer and the p-electrode. The current-blocking layer serves as a distributed Bragg reflector (DBR). The current-blocking layer diffuses current, and the distributed Bragg reflector (DBR) reflects light emitted from the light-emitting layer toward the light extraction face on the n-type semiconductor layer side (see, for example, paragraphs [0010] and [0028] of Patent Document 2).

Patent Document 1: Japanese Patent Application Laid-Open (kokai) No. 2008-192710
Patent Document 2: Japanese Patent Application Laid-Open (kokai) No. 2007-150310

Meanwhile, in some cases, a face-up-type light-emitting device, having a light-extraction face on the p-type semiconductor layer side, may be provided with a current-blocking layer also serving as a distributed Bragg reflector (DBR). In such case, the light emitted from the light-emitting layer toward the p-electrode is reflected by the distributed Bragg reflector (DBR), whereby the light is not absorbed by the p-electrode and is reflected toward the semiconductor layer. Although the light is not absorbed by the p-electrode, the light may be re-absorbed by the light-emitting layer. In order to suppress the re-absorption of light, the current-blocking layer also serving as a distributed Bragg reflector (DBR) preferably has a somewhat small size.

From another viewpoint, semiconductor light-emitting devices preferably attain sufficient current diffusion over a desired device region. For this purpose, the current-blocking layer preferably has a somewhat large size. However, when a wide-area current-blocking layer is formed so as to attain sufficient current diffusion, the light to be extracted to the outside is undesirably reflected toward the semiconductor layer.

SUMMARY OF THE INVENTION

The present techniques have been conceived in order to solve the aforementioned technical problems involved in the conventional techniques. Thus, an object of the present techniques are to provide a Group III nitride semiconductor light-emitting device which realizes sufficient current diffusion in the light emission face of the light-emitting layer and which attains suitable light extraction to the outside. Another object is to provide a method for producing the light-emitting device.

In a first aspect of the present technique, there is provided a Group III nitride semiconductor light-emitting device comprising:

a first semiconductor layer having a first conduction type;

a light-emitting layer disposed on the first semiconductor layer;

a second semiconductor layer having a second conduction type, the layer being disposed on the light-emitting layer;

a transparent electrode disposed on the second semiconductor layer;

a first electrode electrically connected to the first semiconductor layer; and a second electrode electrically connected to the second semiconductor layer. In the Group III nitride semiconductor light-emitting device, an insulating multilayer film intervenes between the second semiconductor layer and the transparent electrode, wherein the insulating multilayer film has a first surface in contact with the second semiconductor layer and a second surface in contact with the transparent electrode. The insulating multilayer film serves as a distributed Bragg reflector and is formed in a region including a projection area obtained by projecting the second electrode to the second semiconductor layer. The insulating multilayer film has a first region and a second region, wherein the first region has a layer thickness greater than 95% of the maximum film thickness of the insulating multilayer film, and the second region has a layer thickness not greater than 95% of the maximum film thickness of the insulating multilayer film. The second surface of the insulating multilayer film in the second region has a slope having a dent portion denting toward the first surface.

The Group III nitride semiconductor light-emitting device has an insulating multilayer film. The insulating multilayer film serves as a current-blocking layer and also as a distributed Bragg reflector (DBR). Since the insulating multilayer film is provided with a dent portion, the insulating multilayer film has a reflection region and a transmission region. Therefore, the insulating multilayer film, serving as a current-blocking layer, inhibits current flow directly under the second electrode and realizes sufficient current diffusion in the light emission face. Also, the insulating multilayer film reflects the light toward the second electrode, and suitably emits the other light to the outside. Thus, a sufficiently wide insulating multilayer film can be formed, whereby the semiconductor light-emitting device exhibits high light emission efficiency.

A second aspect of the technique is drawn to a specific mode of the Group III nitride semiconductor light-emitting device, wherein, in a cross-section which is orthogonal to the first surface and which includes the first region and the second region, the thickness of the insulating multilayer film, at a first point which is located on the second surface and which bisects the width of the second region, is 5% to 40% of the maximum film thickness of the insulating multilayer film.

A third aspect of the technique is drawn to a specific mode of the Group III nitride semiconductor light-emitting device, wherein, in a cross-section which is orthogonal to the first surface and which includes the first region and the second region, a second point at which the thickness of the insulating multilayer film is ½ the maximum film thickness is located in closer vicinity to the first region, as compared with the first point which is located on the second surface and which bisects the width of the second region.

A fourth aspect of the technique is drawn to a specific mode of the Group III nitride semiconductor light-emitting device, wherein, in a cross-section which is orthogonal to the first surface and which includes the first region and the second region, the angle θ1 of a first angle is larger than the angle θ2 of a second angle by ≥5°, wherein the first angle is formed between a first line connecting the first point bisecting the width of the second region to a first end which is located on the second surface and which corresponds to 95% of the maximum film thickness and the first surface of the insulating multilayer film, and the second angle is formed between a second line connecting the first point and a second end located at the periphery of the insulating multilayer film and the first surface of the insulating multilayer film.

A fifth aspect of the technique is drawn to a specific mode of the Group III nitride semiconductor light-emitting device, wherein the first angle θ1 is 15° to 45°.

A sixth aspect of the technique is drawn to a specific mode of the Group III nitride semiconductor light-emitting device, wherein the second angle θ2 is 3° to 30°.

A seventh aspect of the technique is drawn to a specific mode of the Group III nitride semiconductor light-emitting device, wherein the first end which is located on the second surface and which corresponds to 95% of the maximum film thickness is located inside the projection area at a distance of 3 μm or less from the end of the projection area, or outside the projection area at a distance of 7 μm or less from the end of the projection area.

An eighth aspect of the technique is drawn to a specific mode of the Group III nitride semiconductor light-emitting device, wherein, in a region outside the first point which bisects the width of the second region, the insulating multilayer film satisfies the following equation:

$$d < \lambda/(4 \sim n)$$

(wherein d is a total thickness of insulating multilayer film, λ is a wavelength of light, and n is a refractive index of one layer of insulating multilayer film).

In a ninth aspect of the present technique, there is provided a method for producing a Group III nitride semiconductor light-emitting device, the method comprising the following:

a first semiconductor layer formation step of forming a first semiconductor layer having a first conduction type;

a light-emitting layer formation step of forming a light-emitting layer on the first semiconductor layer;

a second semiconductor layer formation step of forming a second semiconductor layer having a second conduction type on the light-emitting layer;

an insulating multilayer film formation step of forming an insulating multilayer film on a portion of the second semiconductor layer;

a transparent electrode formation step of forming a transparent electrode on the insulating multilayer film and the remaining portion of the second semiconductor layer;

a first electrode formation step of forming a first electrode on the first semiconductor layer; and a second electrode formation step of forming a second electrode on the transparent electrode. The insulating multilayer film formation step comprises the following:

a resist application step of applying a resist;
a first exposure step of exposing to light a region other than an insulating multilayer film formation region;
a baking step of heating the resist;
a second exposure step of exposing the entirety of the resist;

a hole-making step of removing a portion which has not been exposed to light in the first exposure step, to thereby provide an end-widened hole;

a film formation step of forming an insulating multilayer film inside the hole; and a resist removal step of removing the resist.

The present techniques provide a Group III nitride semiconductor light-emitting device which realizes sufficient current diffusion in the light emission face of the light-emitting layer and which attains suitable light extraction to the outside, and a production method therefor.

BRIEF DESCRIPTION OF THE DRAWINGS

Various other objects, features, and many of the attendant advantages of the present technique will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
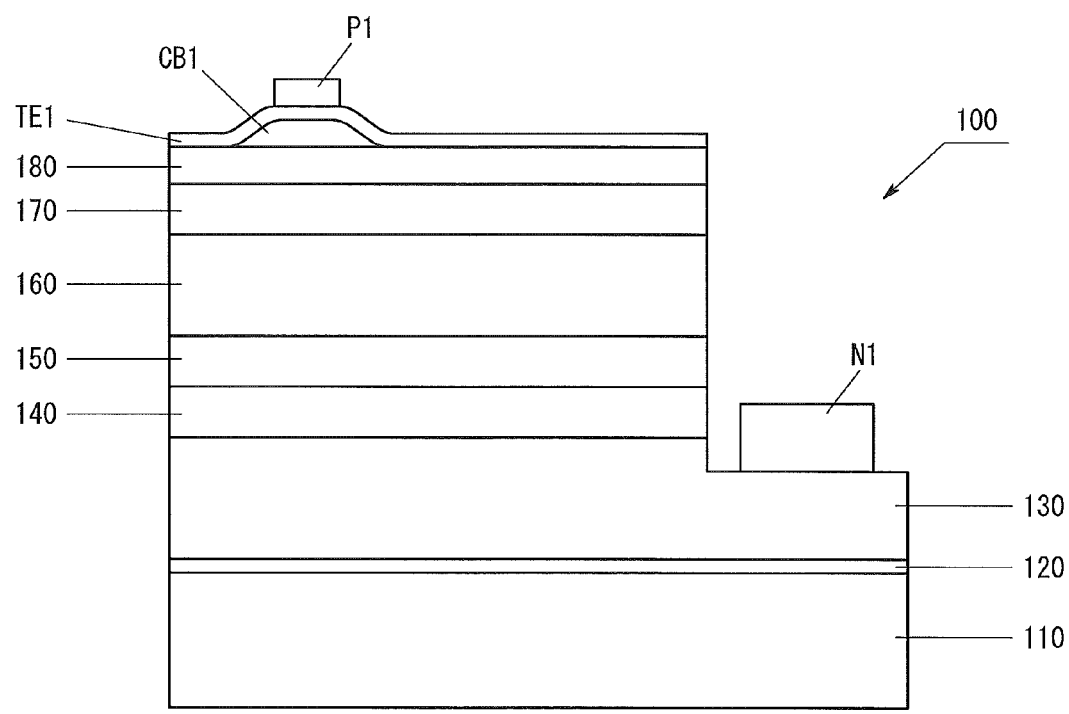
FIG. 1 is a schematic view of the configuration of a light-emitting device of an embodiment.

With reference to the drawings, specific embodiment of the semiconductor light-emitting device and the production method will next be described in detail. However, this embodiment should not be construed as limiting the technique thereto. The below-described stacking configuration of the layers of the semiconductor light-emitting device and the electrode structure are given only for the illustration purpose, and other stacking structures differing therefrom may also be employed. The thickness of each of the layers shown in the drawings is not an actual value, but a conceptual value.

First Embodiment

1. Semiconductor Light-Emitting Device

FIG. 1 is a schematic view of the configuration of a light-emitting device 100 of the first embodiment. The light-emitting device 100 is a face-up-type semiconductor light-emitting device. The light-emitting device 100 has a plurality of semiconductor layers formed of a Group III nitride semiconductor. As shown in FIG. 1, the light-emitting device 100 has a substrate 110, a buffer layer 120, an n-type contact layer 130, an n-side ESD layer 140, an n-side superlattice layer 150, a light-emitting layer 160, a p-side superlattice layer 170, a p-type contact layer 180, an insulating multilayer film CB1, a transparent electrode TE1, a p-electrode P1, and an n-electrode N1.

On the main surface of the substrate 110, the buffer layer 120, the n-type contact layer 130, the n-side ESD layer 140, the n-side superlattice layer 150, the light-emitting layer 160, the p-side superlattice layer 170, and the p-type contact layer 180 are successively formed in this order. The n-electrode N1 is formed on the n-type contact layer 130, and the p-electrode P1 is formed on the transparent electrode TE1.

Each of the n-type contact layer 130, the n-side ESD layer 140, and the n-side superlattice layer 150 is an n-type semiconductor layer. In the first embodiment, the n-type semiconductor layer is a first semiconductor layer of a first conduction type. Each of the p-side superlattice layer 170 and the p-type contact layer 180 is a p-type semiconductor layer. In the first embodiment, the p-type semiconductor layer is a second semiconductor layer of a second conduction type.

In some cases, any of these layers may partially include a non-doped layer. Thus, the light-emitting device 100 includes an n-type semiconductor layer, a light-emitting layer disposed on the n-type semiconductor layer, the p-type semiconductor layer disposed on the light-emitting layer, a transparent electrode TE1 disposed on the p-type semiconductor layer, an n-electrode N1 electrically connected to the n-type semiconductor layer, and a p-electrode P1 electrically connected to the p-type semiconductor layer.

The substrate 110 is a growth substrate. On the main surface of the substrate 110, the aforementioned semiconductor layers are formed through MOCVD. The main surface of the substrate 110 is preferably roughened. The substrate 110 is made of sapphire. Other than sapphire, materials such as SiC, ZnO, Si, GaN, and AlN may be employed.

The buffer layer 120 is formed on the main surface of the substrate 110. The buffer layer 120 is provided so as to form high-density crystal nuclei on the substrate 110. By virtue of the buffer layer 120, growth of a GaN layer having a flat surface is promoted. Examples of the material of the buffer layer 120 include AlN, GaN, BN, and TiN.

The n-type contact layer 130 is formed on the buffer layer 120. The n-type contact layer 130 is in contact with the n-electrode N1. That is, the n-type contact layer 130 is electrically connected to the n-electrode N1. The n-type contact layer 130 is an n-type GaN layer. The n-type contact layer 130 may be composed of a plurality of layers having different carrier concentrations.

The n-side ESD layer 140 is an electrostatic breakdown-preventing layer for preventing electrostatic breakdown of a semiconductor layer. The n-side ESD layer 140 is formed on the n-type contact layer 130. The n-side ESD layer 140 is formed by depositing an i-GaN layer formed of non-doped i-GaN and an n-type GaN layer formed of Si-doped n-type GaN.

The n-side superlattice layer 150 is a strain relaxation layer for relaxing the stress applied to the light-emitting layer 160. The n-side superlattice layer 150 has a superlattice structure. The n-side superlattice layer 150 is, for example, a stacked body in which InGaN layers and n-type GaN layers are repeatedly deposited.

The light-emitting layer 160 emits light through recombination of an electron with a hole. The light-emitting layer 160 is formed on the n-side superlattice layer 150. The light-emitting layer has at least a well layer and a barrier layer. The well layer may be, for example, an InGaN layer or a GaN layer. The barrier layer may be, for example, a GaN layer or an AlGaN layer. These layers are examples, and other layers such as an AlInGaN layer may be employed.

The p-side superlattice layer 170 is formed on the light-emitting layer 160. The p-side superlattice layer 170 is formed by repeatedly depositing a stacked body composed of a p-type GaN layer, a p-type AlGaN layer, and a p-type InGaN layer. The stacked structure is an example. Thus, the p-side superlattice layer 170 may have a stacking structure differing from the above one.

The p-type contact layer 180 is formed on the p-side superlattice layer 170. The p-type contact layer 180 is in contact with the transparent electrode TE1. Thus, the p-type contact layer 180 is electrically connected to the p-electrode P1. The p-type contact layer 180 is formed of Mg-doped GaN.

The insulating multilayer film CB1 prevents current flow directly under the p-electrode P1 and causes current to diffuse in the light emission face. Also, the insulating multilayer film CB1 is a distributed Bragg reflector (DBR). The insulating multilayer film CB1 is formed on a part of the p-type contact layer 180. The insulating multilayer film CB1 intervenes between the transparent electrode TE1 and the part of the p-type contact layer 180.

The transparent electrode TE1 is formed on the insulating multilayer film CB1 and the remaining portion of the p-type contact layer 180. The transparent electrode TE1 is formed of ITO. Other than ITO, transparent oxides such as ICO, IZO, ZnO, $TiO_2$, $NbTiO_2$, and $TaTiO_2$ may be employed.

The p-electrode P1 is formed on the transparent electrode TE1. The p-electrode P1 is in contact with the transparent electrode TE1. That is, the p-electrode P1 is electrically connected to the p-type contact layer 180. The p-electrode P1 includes a V layer and an Al layer sequentially formed from the surface of the transparent electrode TE1. Alternatively, this combination may be Ti and Al, or Ti and Au.

The n-electrode N1 is formed on the n-type contact layer 130. The n-electrode N1 is in contact with the n-type contact layer 130. That is, the n-electrode N1 is electrically connected to the n-type contact layer 130. The n-electrode N1 includes a V layer and an Al layer sequentially formed from the surface of the n-type contact layer 130. Alternatively, this combination may be Ti and Al, or Ti and Au.

2. Insulating Multilayer Film

2-1. Structure of Insulating Multilayer Film and Adjacent Layers

As shown in FIG. 1, the insulating multilayer film CB1 covers a part of the p-type contact layer 180. The transparent electrode TE1 covers the insulating multilayer film CB1 and the remaining portion of the p-type contact layer 180. The insulating multilayer film CB1 intervenes between the p-type contact layer 180 and the transparent electrode TE1.

2-2. Structure of Insulating Multilayer Film

Figure 2:
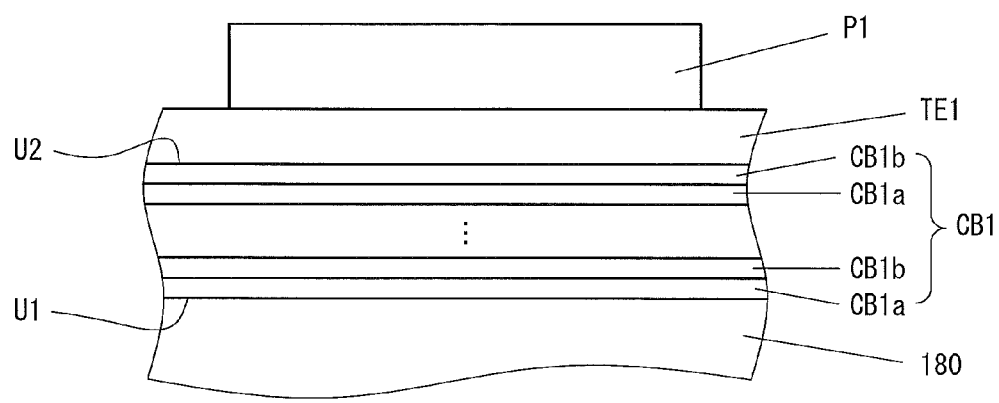
FIG. 2 is a view of the structure of an insulating multilayer film of the light-emitting device of the embodiment.

As described above, the insulating multilayer film CB1 is a distributed Bragg reflector (DBR). Thus, as shown in FIG. 2, the insulating multilayer film CB1 is a stacking structure in which sets of two layers having different refractive index are repeatedly stacked. More specifically, as shown in FIG. 2, the insulating multilayer film CB1 is formed through repeatedly and alternatingly forming first insulating layers CB1$a$ and second insulating layers CB1$b$.

In the insulating multilayer film CB1, each of the first insulating layers CB1$a$ and the second insulating layers CB1$b$ is a transparent insulator. The insulating multilayer film CB1 is formed through repeatedly forming, for example, $SiO_2$ layers and $TiO_2$ layers. The material may also be $Al_2O_3$, or another material. The thickness of each of the layers made of two kinds of materials may be predetermined in view of the refractive index of each material and the wavelength of the emitted light. Any number of repetition may be employed.

2-3. Position of Dent Portion

Figure 3:
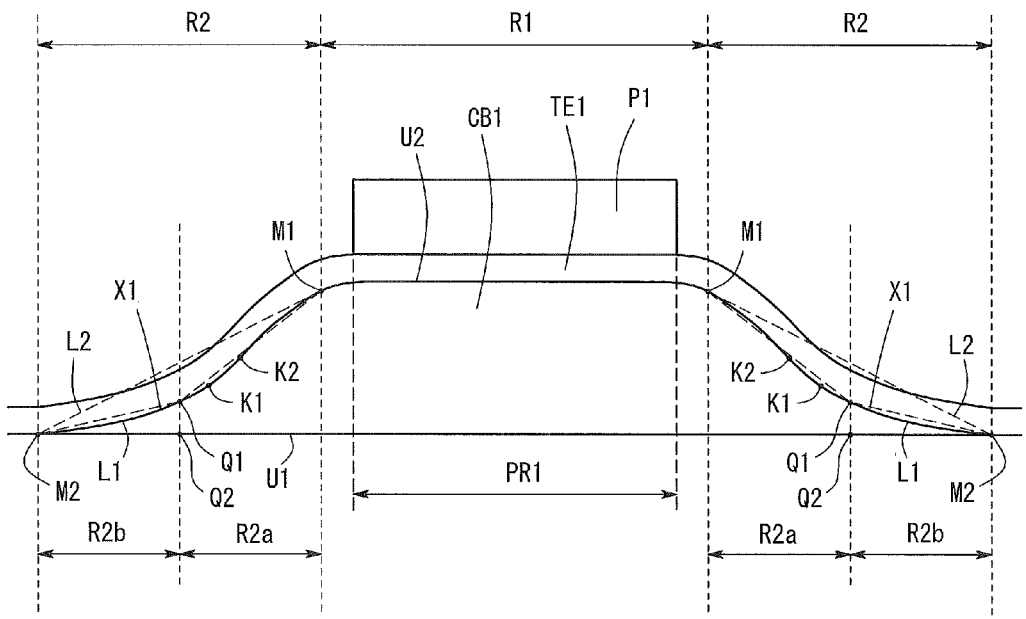
FIG. 3 is a view of the structure of an insulating multilayer film and other elements of the light-emitting device of the embodiment.

FIG. 3 is a cross-sectional view of the insulating multilayer film CB1 and other elements in the vicinity of the film. The insulating multilayer film CB1 intervenes between the p-type contact layer 180 and the transparent electrode TE1. The insulating multilayer film CB1 is in contact with the p-type contact layer 180 via the mediation of a first surface U1 of the film, and in contact with the transparent electrode TE1 via a second surface U2 of the film. The first surface U1 is a flat plane, and the second surface U2 is a curved plane. As shown in FIG. 3, the insulating multilayer film CB1 is formed in a region including a projection area PR1 obtained by projecting the p-electrode P1 to the p-type contact layer 180 (i.e., the first surface U1).

As shown in FIG. 3, the insulating multilayer film CB1 has a first region R1, and a second region R2 surrounding the first region R1. The first region R1 has a layer thickness greater than 95% of the maximum film thickness of the insulating multilayer film CB1. Thus, the first region R1 is located at the central part of the insulating multilayer film CB1. The second region R2 has a layer thickness not greater than 95% of the maximum film thickness of the insulating multilayer film CB1. Thus, the second region R2 is a peripheral region with respect to the first region R1. That is, the cross-section of FIG. 3 includes a cross-section orthogonal to the first surface U1, the cross-section including the first region R1 and the second region R2.

As shown in the cross-section of FIG. 3, the second surface U2 in the first region R1 of the insulating multilayer film CB1 is generally flat. The second surface U2 in the second region R2 of the insulating multilayer film CB1 has a slope L1. The slope L1 has a dent portion X1 which dents toward the first surface U1 of the insulating multilayer film CB1. In the second region R2, the thickness of the insulating multilayer film CB1 steeply decreases, and the thickness reduction rate decreases at a position corresponding to a certain thickness.

In FIG. 3, an imaginary line L2 is given. The line L2 imaginarily connects an end M1 to an end M2. The end M1 is a first end on the second surface U2 at which the thickness of CB1 is 95% of the maximum film thickness. The end M1 is located at the boundary between the first region R1 and the second region R2. The end M2 is a second end on the second surface U2 which is located at the periphery of the insulating multilayer film CB1.

As shown in FIG. 3, the slope L1 has the dent portion X1. The dent portion X1 has a point K1. The point K1 is a point in the second surface U2 most distant from the line L2. The second region R2 includes an inner region R2$a$ and an outer region R2$b$. The inner region R2$a$ and the outer region R2$b$ have the same width in the cross-section. A point Q1 and a point Q2 are located at the boundary between the inner region R2$a$ and the outer region R2$b$. In other words, the points Q1 and Q2 are those bisecting the width of the second region R2. The point Q1 is located on the second surface U2, and the point Q2 is located on the first surface U1.

The point K1 is located in the inner region R2$a$. That is, the point K1 is located at a position in closer vicinity to the center, as compared with the point Q1, namely, is located in the vicinity of the first region R1. Thus, the point K1 is located in closer vicinity to the first region R1, as compared with the point Q1 bisecting the width of the second region R2.

2-4. Points Q1 and Q2 (on the Line Bisecting the Width of Second Region R2)

Next will be described a cross-section orthogonal to the first surface U1, the cross-section including the first region R1 and the second region R2. The point Q1 is located on the second surface U2 and at the boundary between the inner region R2$a$ and the outer region R2$b$. That is, the point Q1 is a first point which is located on the second surface U2 and which bisects the width of the second region R2. The thickness of the insulating multilayer film CB1 at the point Q1 is less than 50% of the maximum film thickness of the insulating multilayer film CB1. The thickness is, for example, 5% to 40% of the maximum film thickness, preferably 10% to 30% of the maximum film thickness.

The point Q2 is located on the first surface U1 and at the boundary between the inner region R2$a$ and the outer region R2$b$. That is, the point Q2 is located at the boundary between the insulating multilayer film CB1 and the p-type contact layer 180. The distance between the point Q1 and the point Q2 is equivalent to the film thickness of the insulating multilayer film CB1 at the point Q1 bisecting the second region R2.

2-5. Point K2 (at the Position Corresponding to 50% Thickness)

The point K2 is a point at which the thickness of the insulating multilayer film CB1 is ½ the maximum film thickness. The point K2 is located in the inner region R2$a$. That is, the point K2 is a second point which is located in closer vicinity to the first region R1, as compared with the point Q1 bisecting the width of the second region R2. In other words, the point K2 is located in the more vicinity to the center, as compared with the point Q1; i.e., is in the vicinity of the first region R1, since the insulating multilayer film CB1 has the dent portion X1.

2-6. Angle of Slope

Figure 4:
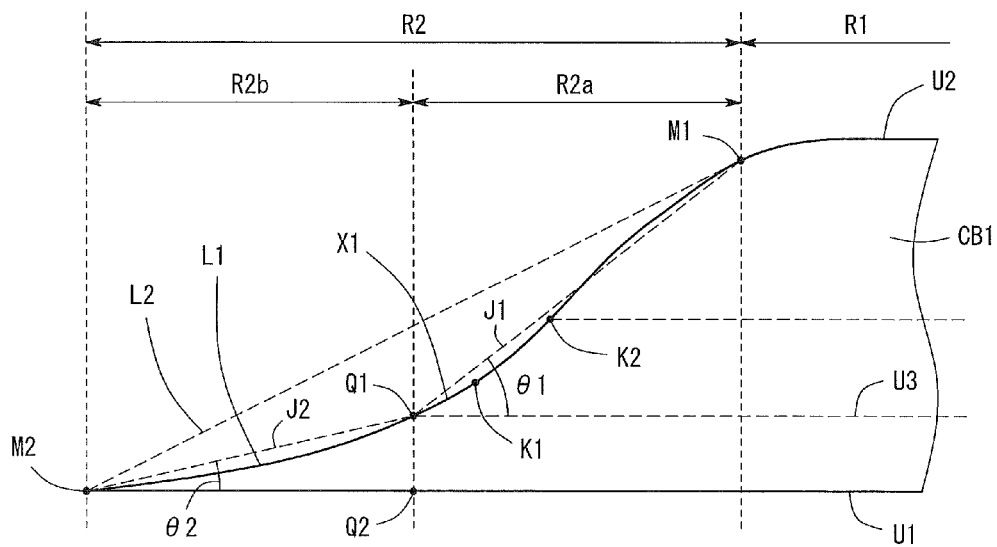
FIG. 4 is an enlarged view of the structure shown in FIG. 3.

FIG. 4 is an enlarged view of a portion extracted from the insulating multilayer film CB1 shown in FIG. 3. In FIG. 4, a line J1 connecting the end M1 to the point Q1, and a line J2 connecting the end M2 and the point Q1 are given. The angle $\theta 1$ of a first angle is larger than the angle $\theta 2$ of a second angle by $\geq 5°$. As shown in FIG. 4, the first angle ($\theta 1$) is formed between the line J1 and a surface U3 which is in parallel to the first surface U1 of the insulating multilayer film CB1. The first angle ($\theta 1$) is equal to the angle between the line J1 and the first surface U1 of the insulating multilayer film CB1. The second angle (θ2) is an angle formed between the line J2 and the first surface U1 of the insulating multilayer film CB1.

The angle (θ1) is 15° to 45°, preferably 20° to 35°. The angle (θ2) is 3° to 30°, preferably 5° to 20°. The angle ranges are merely examples, and other angle values may be acceptable.

3. Effects of Insulating Multilayer Film 3-1. Reflection Region and Light Transmission Region (Hereinafter Referred to Simply as Transmission Region)

Figure 5:
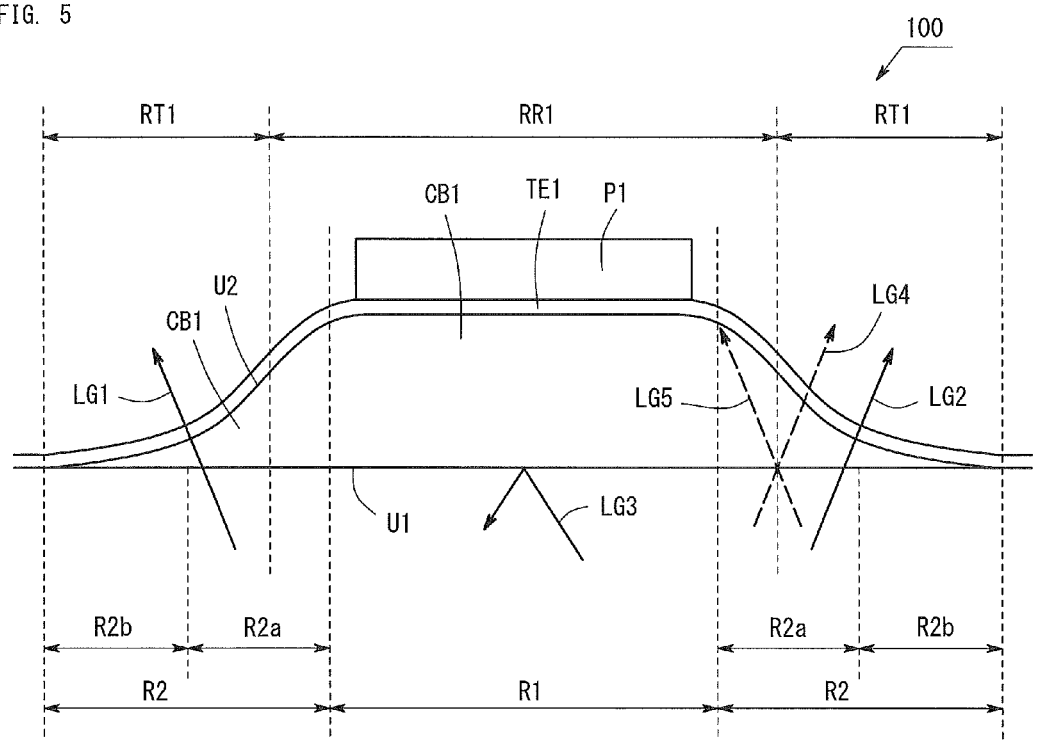
FIG. 5 is a view showing the concepts of a reflection region and a transmission region in the light-emitting device of the embodiment.

As shown in FIG. 5, the light-emitting device 100 of the first embodiment has a reflection region RR1 and a transmission region RT1. The reflection region RR1 includes the first region R1 and a portion of the second region R2. The transmission region RT1 includes the remaining portion of the second region R2.

The thickness of the reflection region RR1 is sufficiently greater than the wavelength of the light emitted by the light-emitting layer 160. The insulating multilayer film CB1 is formed so as to reflect the light emitted by the light-emitting layer 160. Thus, in the reflection region RR1, light LG3 emitted by the light-emitting layer 160 toward the p-electrode P1 is reflected by the insulating multilayer film CB1 toward the semiconductor layer. As shown in FIG. 5, light LG3 is reflected by the first surface U1, which is a surface of the insulating multilayer film CB1. However, the light emitted by the light-emitting layer 160 toward the p-electrode P1 may be reflected by a plane in the insulating multilayer film CB1 at a deeper level.

The film thickness of the transmission region RT1 is sufficiently small, as compared with the wavelength of the light emitted by the light-emitting layer 160. Thus, the thickness does not meet the following equation:

$$n \cdot d = \lambda/4$$

(wherein n is a refractive index, d is a film thickness, and λ is a wavelength of light). Thus, the transmission region RT1 cannot reflect the light but transmits it. In other words, in the transmission region RT1, the light (LG1 and LG2) emitted by the light-emitting layer 160 is transmitted to the outside. Thus, light is extracted.

The outer region Rb2 is included in the transmission region RT1. Thus, in the outer region R2b, the insulating multilayer film CB1 satisfies the following equation:

$$d < \lambda/(4 \cdot n)$$

(wherein d is a total thickness of insulating multilayer film, λ is a wavelength of light, and n is a refractive index of one layer of insulating multilayer film).

The boundary between the reflection region RR1 and the transmission region RT1 is determined by wavelength of light (λ) and film thickness (d). In addition, as shown in FIG. 5, when the light is emitted toward the same position, the film thickness of CB1 varies depending on the light incident angle. Thus, light LG4 transmits through the insulating multilayer film CB1, but light LG5 is reflected by the insulating multilayer film CB1. In this way, the boundary between the reflection region RR1 and the transmission region RT1 is not always definite. Thus, in the vicinity of this boundary, light transmits or does not transmit, depending on the incident angle.

Therefore, the reflection region RR1 and the transmission region RT1 are not actual regions but conceptual regions. However, as shown in FIG. 5, the light (LG5) emitted toward the p-electrode P1 can be reflected, and the light (LG4) emitted not toward the p-electrode P1 can be suitably extracted.

3-2. Role as Current-Blocking Layer

The insulating multilayer film CB1 also serves as a current-blocking layer. Thus, the insulating multilayer film CB1 can be designed to have a large size. The insulating multilayer film CB1, serving as a current-blocking layer, realizes sufficient current diffusion and can emit light at high efficiency to the outside, at the peripheral portion of the device. Furthermore, the insulating multilayer film CB1 suppresses light absorption by the p-electrode P1. Accordingly, the light-emitting device 100 exhibits excellent light emission efficiency.

3-3. Other Effects

The percent change in the angle of the slope L1 is not very large. Thus, breakage of the transparent electrode TE1 on the second surface U2 is virtually prevented.

4. Method of Forming an Insulating Multilayer Film

The insulating multilayer film CB1 of the first embodiment has a unique structure as shown in FIGS. 3 and 4 and other drawings. The insulating multilayer film CB1 is formed through the following procedure.

4-1. Resist Application Step

Figure 6:
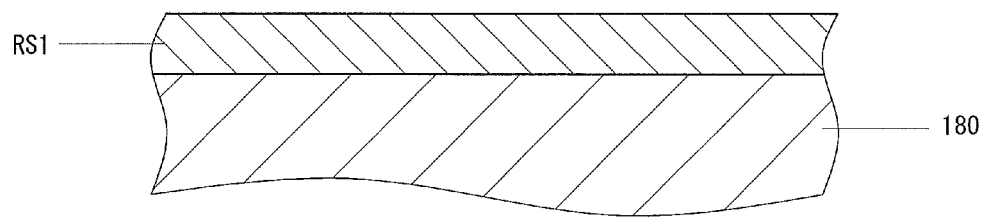
FIG. 6 is a view (1) showing a step of forming an insulating multilayer film of the light-emitting device of the embodiment.

Firstly, as shown in FIG. 6, a resist RS1 is applied onto the p-type contact layer 180. The resist RS1 can be dissolved in a specific solvent through exposure to light and becomes insoluble and stable through heat treatment. Examples of the resist RS1 include AZ5214 (product of Clariant (Japan) K.K.).

4-2. First Light Exposure Step

Figure 7:
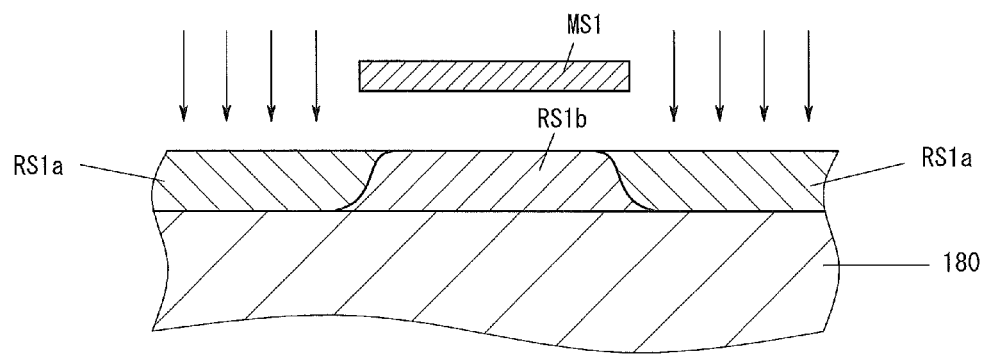
FIG. 7 is a view (2) showing a step of forming an insulating multilayer film of the light-emitting device of the embodiment.

Next, as shown in FIG. 7, the resist RS1 is exposed to light through a mask MS1. The mask MS1 has almost the same area as the area where the insulating multilayer film CB1 is to be formed. Thus, in the first exposure step, an area excepting the insulating multilayer film CB1 formation region is mainly exposed to light. Through first light exposure, the portion RS1a of the resist RS1, which has been exposed to light, can be dissolved in a specific solvent. In contrast, the area RS1b of the resist RS1, which has not been exposed to light, is still insoluble to the same solvent. The area which is not covered with the mask MS1 is irradiated with light to the full depth of the resist RS1. In contrast, the area which is covered with the mask MS1 is never irradiated with light to the full depth of the resist RS1. At the interface between the two areas of the resist RS1, a portion of the resist RS1 to a certain depth is irradiated with light, and the remaining portion thereof is not irradiated with light.

4-3. Baking Step

Figure 8:
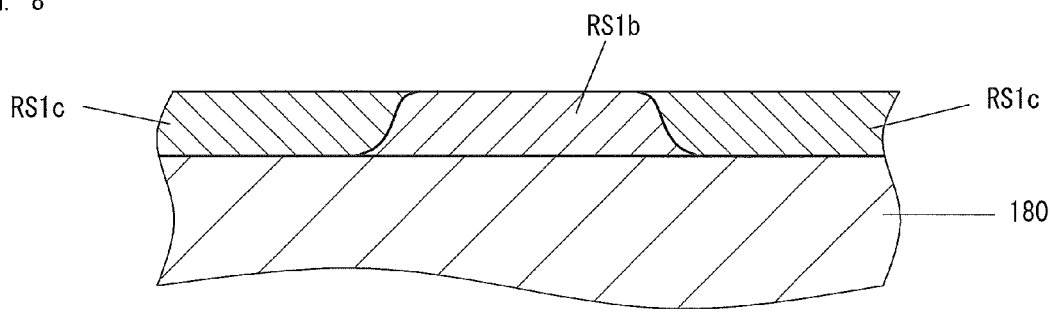
FIG. 8 is a view (3) showing a step of forming an insulating multilayer film of the light-emitting device of the embodiment.

Then, as shown in FIG. 8, the resist RS1 is heated to a predetermined temperature. The baking temperature varies depending on the type of the resist RS1. The portion RS1a is converted to a portion RS1c through first light exposure. The portion RS1c is insoluble and stable in the predetermined solvent. In contrast, the portion RS1b, which has not undergone first light exposure, remains insoluble in the same solvent.

4-4. Second Light Exposure Step

Figure 9:
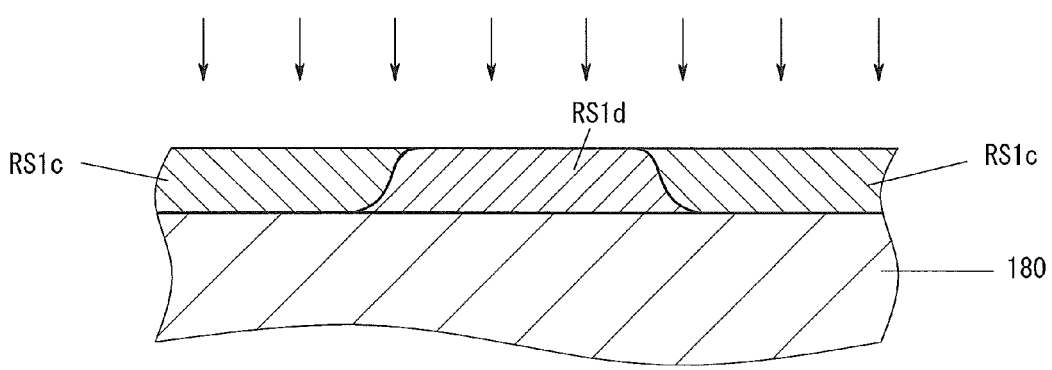
FIG. 9 is a view (4) showing a step of forming an insulating multilayer film of the light-emitting device of the embodiment.

Then, as shown in FIG. 9, the entirety of the resist RS1 is exposed to light (i.e., second light exposure). The second light exposure is carried out without use of a mask. The portion RS1d is a region which has not undergone first light exposure but has undergone second light exposure. Through second light exposure, the portion RS1d comes to have solubility in a specific solvent. The portion RS1c is a region which has undergone first light exposure and second light exposure. The portion RS1c is insoluble and stable after the baking step. Thus, the portion RS1c remains insoluble and stable in the solvent.

4-5. Hole-Making Step

Figure 10:
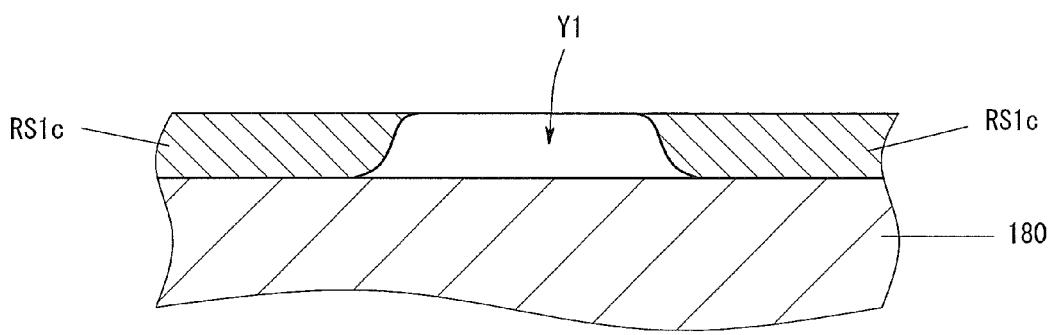
FIG. 10 is a view (5) showing a step of forming an insulating multilayer film of the light-emitting device of the embodiment.

Next, the soluble portion RS1*d* of the resist RS1 is dissolved in a specific solvent. That is, the portion which has not been exposed to light in the first light exposure step is removed. Through this procedure, a hole Y1 for forming the insulating multilayer film CB1 is provided, as shown in FIG. 10. The shape of the hole Y1 is almost the same as that of the insulating multilayer film CB1. The hole Y1 has an end-widened shape. That is, the diameter of the hole Y1 increases from the opening thereof to the bottom.

4-6. Film Formation Step

Figure 11:
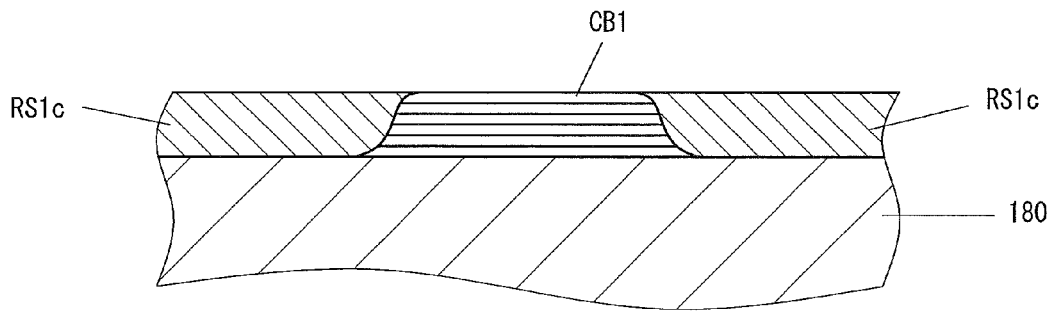
FIG. 11 is a view (6) showing a step of forming an insulating multilayer film of the light-emitting device of the embodiment.

Then, as shown in FIG. 11, the insulating multilayer film CB1 is formed inside the hole Y1, which is a void portion of the resist RS1. The film may be formed through electron beam vapor deposition. Alternatively, electron beam vapor deposition and an ion gun technique may be employed in combination. Yet alternatively, sputtering may be employed. In the film formation step, the insulating multilayer film CB1 is formed such that the void of the hole Y1 is substantially buried. However, a certain amount of remaining space may be acceptable. Even in such a case, the insulating multilayer film CB1 having the aforementioned shape can be formed.

4-7. Resist Removal Step

Subsequently, the resist RS1 is removed. Specifically, the portion RS1*c* is removed by use of a chemical liquid which can remove the resist RS1. Through the aforementioned procedure, the insulating multilayer film CB1 can be formed on the p-type contact layer 180.

5. Method for Producing Semiconductor Light-Emitting Device

Next will be described a method for producing the light-emitting device 100 of the first embodiment. In the first embodiment, the semiconductor crystal layers are formed through epitaxial growth based on metalorganic chemical vapor deposition (MOCVD). Accordingly, the production method includes the following: a first semiconductor layer formation step of forming a first semiconductor layer having a first conduction type; a light-emitting layer formation step of forming a light-emitting layer on the first semiconductor layer; a second semiconductor layer formation step of forming a second semiconductor layer having a second conduction type on the light-emitting layer; an insulating multilayer film formation step of forming an insulating multilayer film on a portion of the second semiconductor layer; a transparent electrode formation step of forming a transparent electrode on the insulating multilayer film and the remaining portion of the second semiconductor layer; a first electrode formation step of forming a first electrode on the first semiconductor layer; and a second electrode formation step of forming a second electrode on the transparent electrode.

Examples of the carrier gas employed in the growth of semiconductor layers include hydrogen ($H_2$), nitrogen ($N_2$), and a mixture of hydrogen and nitrogen ($H_2+N_2$). Ammonia gas ($NH_3$) is used as a nitrogen source, and trimethylgallium ($Ga(CH_3)_3$: (TMG)) is used as a gallium source. Trimethylindium ($In(CH_3)_3$: TMI) is used as an indium source, and trimethylaluminum ($Al(CH_3)_3$: (TMA) is used as an aluminum source. Silane ($SiH_4$) is used as an n-type dopant gas, and cyclopentadienylmagnesium ($Mg(C_5H_5)_2$) is used as a p-type dopant gas.

5-1. n-Type Contact Layer Formation Step

Firstly, the substrate 110 is cleaned with hydrogen gas. Then, the buffer layer 120 is formed on the main surface of the substrate 110, and the n-type contact layer 130 is formed on the buffer layer 120. During the above layer formation, the substrate temperature is 1,080° C. to 1,140° C.

5-2. n-Side ESD Layer Formation Step

Subsequently, the n-side ESD layer 140 is formed on the n-type contact layer 130. For forming the i-GaN layer, feed of silane ($SiH_4$) is stopped. In this procedure, the substrate temperature is, for example, 750° C. to 950° C. Then, for forming n-type GaN, feed of silane ($SiH_4$) is started again. In the subsequent procedure, the substrate temperature is 750° C. to 950° C., which is the same range as employed in the formation of the i-GaN layer.

5-3. n-Side Superlattice Layer Formation Step

Then, the n-side superlattice layer 150 is formed on the n-side ESD layer 140. In one specific mode, InGaN layers and n-type GaN layers are repeatedly deposited. In this procedure, the substrate temperature is, for example, 700° C. to 950° C.

5-4. Light-Emitting Layer Formation Step

On the n-side superlattice layer 150, the light-emitting layer 160 is formed. In one specific mode, InGaN layers, GaN layers, and AlGaN layers are repeatedly deposited. In this procedure, the substrate temperature is, for example, 700° C. to 900° C.

5-5. p-Side Superlattice Layer Formation Step

On the light-emitting layer 160, the p-side superlattice layer 170 is formed. In one specific mode, p-type GaN layers, p-type AlGaN layers, and p-type InGaN layers are repeatedly deposited. Cyclopentadienylmagnesium ($Mg(C_5H_5)_2$) may be used as a p-type dopant gas.

5-6. p-Type Contact Layer Formation Step

Figure 12:
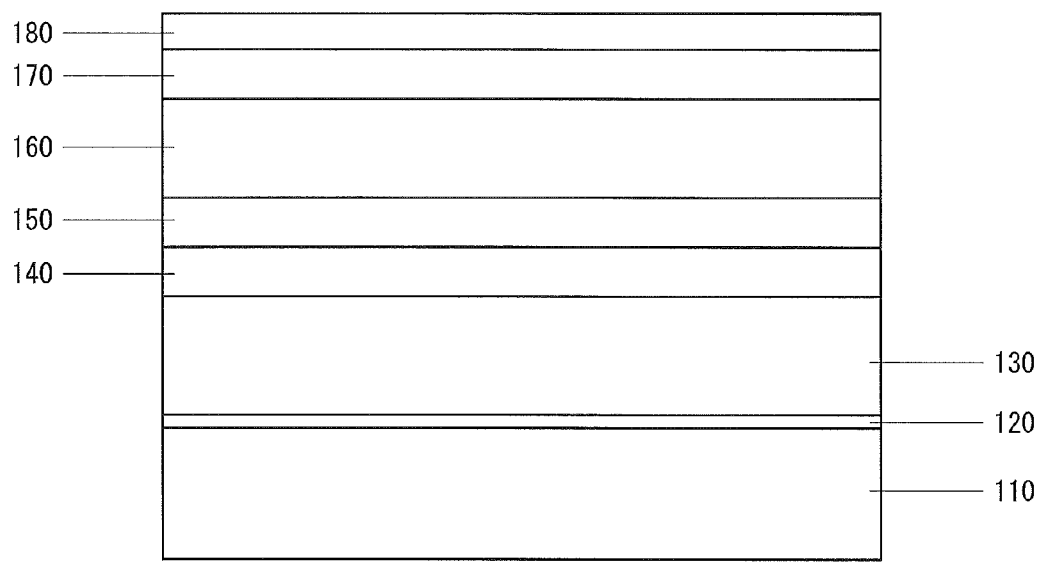
FIG. 12 is a view (1) showing a method for forming the light-emitting device of the embodiment.

On the p-side superlattice layer 170, the p-type contact layer 180 is formed. The substrate temperature is adjusted to fall within a range of 900° C. to 1,100° C. Through this procedure, these semiconductor layers are formed on the substrate 110, as shown in FIG. 12.

5-7. Insulating Multilayer Film Formation Step

Figure 13:
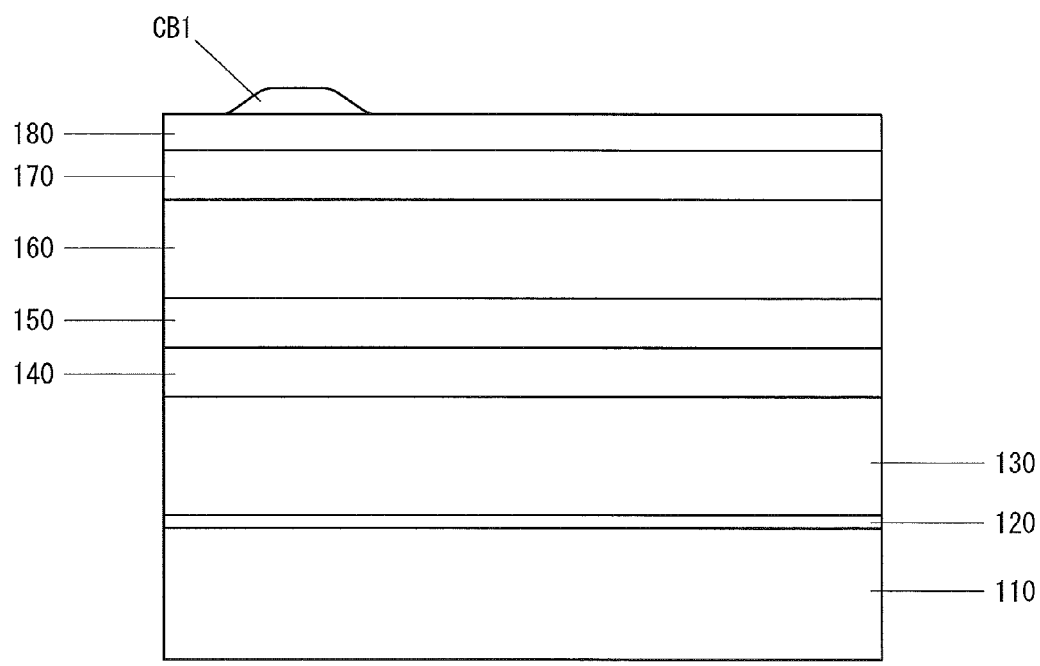
FIG. 13 is a view (2) showing a method for forming the light-emitting device of the embodiment.

Subsequently, as shown in FIG. 13, the insulating multilayer film CB1 is formed on a portion of the p-type contact layer 180. For this purpose, as described above, the resist application step, the first exposure step, the baking step, the second exposure step, the hole-making step, the film formation step, and the resist removal step are performed.

5-8. Transparent Electrode Formation Step

Figure 14:
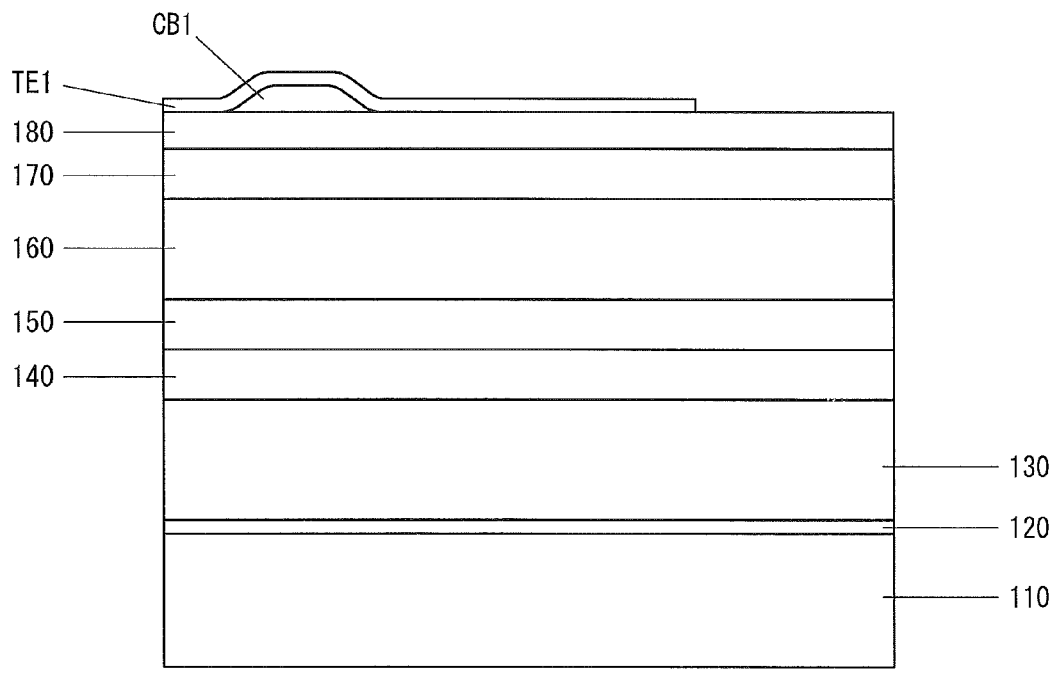
FIG. 14 is a view (3) showing a method for forming the light-emitting device of the embodiment.

Then, as shown in FIG. 14, the transparent electrode TE1 is formed on the insulating multilayer film CB1 and the remaining portion of the p-type contact layer 180. The transparent electrode TE1 may be formed through sputtering or a vapor deposition technique. Through this procedure, the insulating multilayer film CB1 is covered with the p-type contact layer 180 and the transparent electrode TE1. On a portion of the p-type contact layer 180, where a dent portion for exposing the n-type contact layer 130 is to be provided, the transparent electrode TE1 is not necessarily formed.

5-9. Electrode Formation Step

Figure 15:
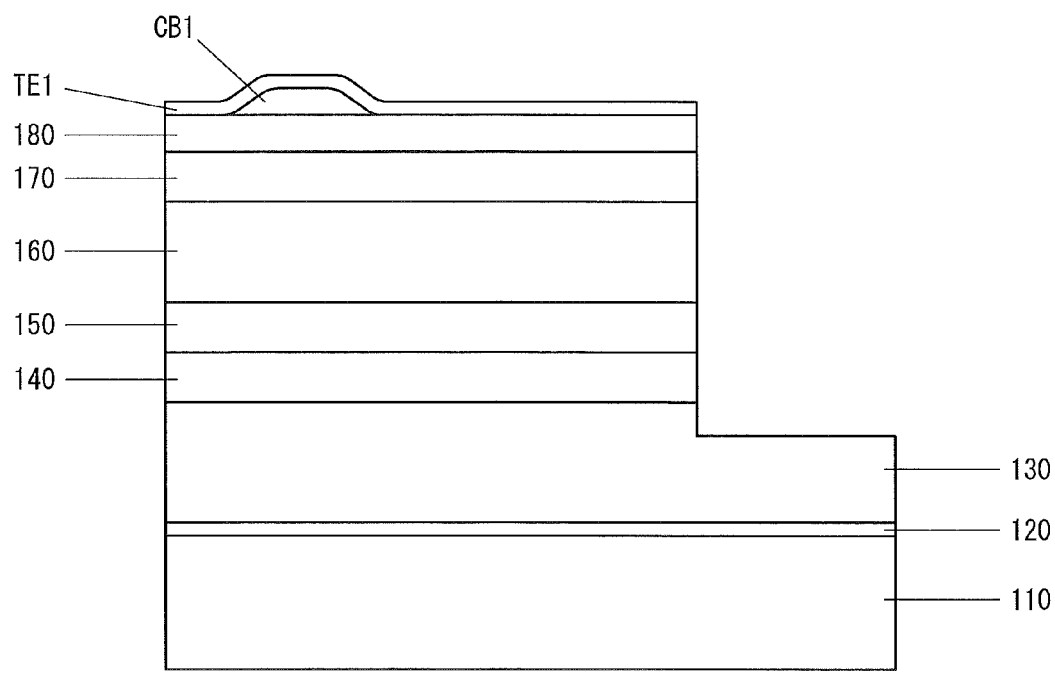
FIG. 15 is a view (4) showing a method for forming the light-emitting device of the embodiment.

On the transparent electrode TE1, the p-electrode P1 is formed. As shown in FIG. 15, the semiconductor layers are partially removed through laser radiation or etching from the p-type contact layer 180 side, to thereby expose the n-type contact layer 130. Then, the n-electrode N1 is formed on the thus-exposed region. Either of the p-electrode P1 formation step and the n-electrode N1 formation step may be performed first.

5-10. Other Steps

In addition to the aforementioned steps, additional steps such as a step of covering the device with a protective film and a heat treatment step may be carried out. Notably, the step of exposing the n-type contact layer 130 may be performed at any timing, so long as the p-type contact layer 180 has already been formed. In this way, the light-emitting device 100 shown in FIG. 1 is produced.

6. Experiments

6-1. Preparation of Samples

Next will be described in detail experiments performed so as to check performance of the insulating multilayer film CB1 of the first embodiment. Samples of the insulating multilayer film CB1 were prepared in the following manner. In the experiments, $SiO_2$ (75 nm) and $TiO_2$ (49 nm) were alternatingly stacked, and the stacking operation was repeatedly performed 8 times, to thereby form an insulating multilayer film CB1. Samples for Examples 1 to 4 each were provided with the thus-formed insulating multilayer film CB1.

Figure 16:
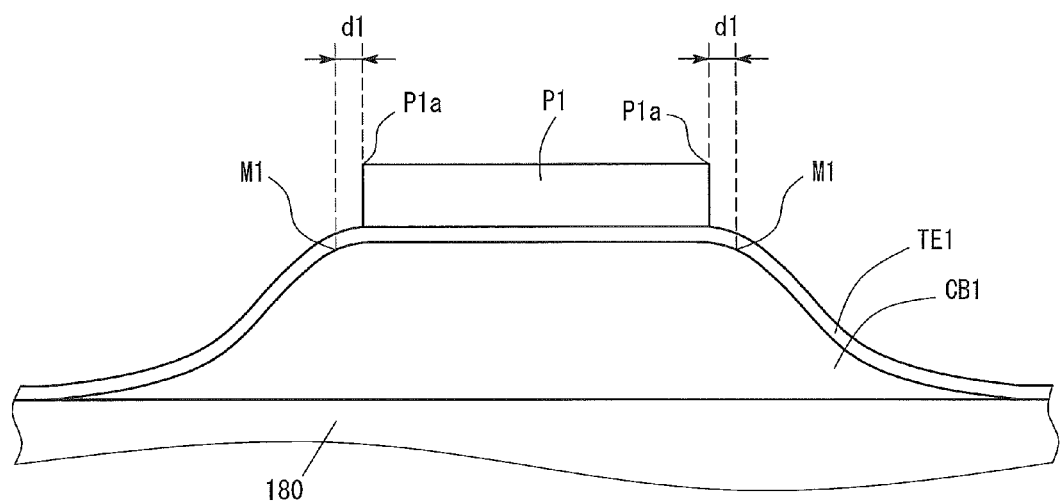
FIG. 16 is a conceptual view (1) of a p-electrode formation region in an experiment.
Figure 17:
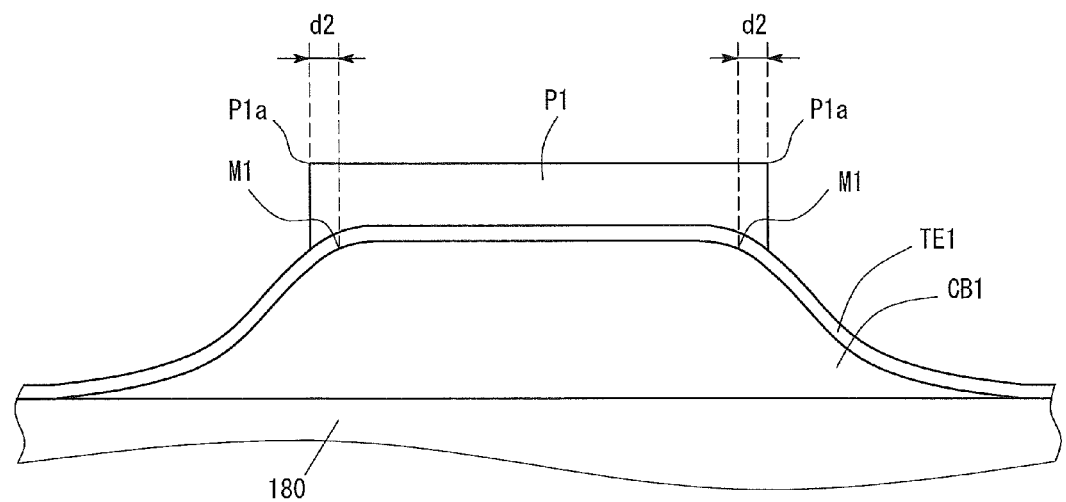
FIG. 17 is a conceptual view (2) of a p-electrode formation region in an experiment.

In the experiments of Examples 1 to 4, as shown in FIGS. 16 and 17, the width of the p-electrode P1 was varied. There were prepared a sample in which the width of the p-electrode P1 was adjusted to be smaller than the distance between ends M1 as shown in FIG. 16, and a sample in which the width of the p-electrode P1 was adjusted to be greater than the distance between ends M1 as shown in FIG. 17. As Comparative Example 1, an $SiO_2$ layer (film thickness: 130 nm) was formed. The $SiO_2$ layer was a single-layer film, and the shape of the $SiO_2$ film differed from that of the insulating multilayer film CB1 of the first embodiment.

6-2. Experimental Results

Table 1 shows the results of the experiments. Regarding the locational features shown in Table 1, the case in which the end P1a of the p-electrode P1 was in closer vicinity to the center as compared with the end M1 as shown in FIG. 16 is denoted by "+," whereas the case in which the end M1 was in closer vicinity to the center as compared with the end P1a of the p-electrode P1 as shown in FIG. 17 is denoted by "−." In Example 1, the width d1 in FIG. 16 was +2 μm. In Example 2, the width d1 in FIG. 16 was +4 μm. In Example 3, the width d1 in FIG. 16 was +6 μm. In Example 4, the width d2 in FIG. 17 was −2 μm.

Also, in Table 1, the case in which a target light-emitting device had no insulating multilayer film CB1 or $SiO_2$ single-layer film was employed as a standard of percent rise in total radiant flux. That is, when the target light-emitting device had no insulating multilayer film CB1 or $SiO_2$ single-layer film, the percent rise in total radiant flux was 0%.

As shown Table 1, the percent rise in total radiant flux of the sample of Example 1 was 1.15%; the percent rise in total radiant flux of the sample of Example 2 was 0.92%; the percent rise in total radiant flux of the sample of Example 3 was 0.83%; and the percent rise in total radiant flux of the sample of Example 4 was 0.85%. Thus, in Examples 1 to 4, the percent rise in total radiant flux was higher than 0.8%.

The percent rise in total radiant flux of the sample of Comparative Example 1 was 0.68%, which is lower than 0.7%. Accordingly, the percent rise in total radiant flux is higher in Examples 1 to 4 than in Comparative Example 1.

Thus, in the case where the end M1 of the insulating multilayer film CB1 is in the more vicinity (by ≤3 μm) of the center as compared with the end P1a of the p-electrode P1, or in the case where the end M1 of the insulating multilayer film CB1 is further away (by ≤7 μm) from the center as compared with the end P1a of the p-electrode P1 (i.e., the end of the projection region PR1), the total radiant flux of the light-emitting device 100 is great.

Preferably, in the case where the end M1 of the insulating multilayer film CB1 is further away (by 0 to 5 μm) from the center as compared with the end P1a of the p-electrode P1, the total radiant flux of the light-emitting device 100 is greater. More preferably, in the case where the end M1 of the insulating multilayer film CB1 is further away (by 1 to 4 μm) from the center as compared with the end P1a of the p-electrode P1, the total radiant flux of the light-emitting device 100 is further greater.

TABLE 1

| | Insulating layer | Locational feature | % Rise in total radiant flux |
|---|---|---|---|
| Ex. 1 | Insulating multilayer film | +2 μm | 1.15% |
| Ex. 2 | Insulating multilayer film | +4 μm | 0.92% |
| Ex. 3 | Insulating multilayer film | +6 μm | 0.83% |
| Ex. 4 | Insulating multilayer film | −2 μm | 0.85% |
| Comp. Ex. 1 | $SiO_2$ single-layer film | +3 μm | 0.68% |

7. Variants

7-1. Type of Light-Emitting Device

The light-emitting device 100 of the first embodiment is a face-up-type light-emitting device, having one contact electrode (transparent electrode TE1). However, alternatively, the light-emitting device of the present technique may be a flip-chip-type light-emitting device, having a plurality of contact electrodes.

7-2. Conduction Type

In the first embodiment, the first conduction type was n-type, and the second conduction type was p-type. However, the combination of conduction type may be inverted. That is, the first conduction type may be p-type, and the second conduction type may be n-type.

7-3. Number of Dent Portion(s)

The slope L1 of the light-emitting device 100 of the first embodiment has one dent portion X1. However, alternatively, the slope L1 may have two or more dent portions observed in a cross-section.

8. Summary of First Embodiment

As described hereinabove, the light-emitting device 100 of the first embodiment has a first region R1 and a second region R2 surrounding the first region R1. The first region R1 has a layer thickness greater than 95% of the maximum film thickness of the insulating multilayer film CB1 and is located at the central part of the insulating multilayer film CB1. The second region R2 has a layer thickness not greater than 95% of the maximum film thickness of the insulating multilayer film CB1 and is a peripheral region with respect to the first region R1. In a cross-section of the light-emitting device, the second region R2 includes a dent portion X1. By virtue of such a structure, the insulating multilayer film CB1 has a reflection region RR1, which reflects light, and a transmission region RT1, which transmits light. Thus, according to the light-emitting device 100, the light emitted toward the p-electrode P1 can be reflected, and the light emitted not toward the p-electrode P1 can be suitably extracted.

The method for producing the semiconductor light-emitting device of the first embodiment includes a resist application step, a first exposure step, a baking step, a second exposure step, a hole-making step, a film formation step, and a resist removal step. According to the production method, the first region R1 having a large film thickness, and the second region R2 having a small film thickness can be suitably formed.

The aforementioned embodiments are merely examples. It is therefore understood that those skilled in the art can provide various modifications and variations of the technique, so long as those fall within the scope of the present technique. The stacking structure of the stacked body should not be limited to those as illustrated, and the stacking structure, the number of repetition of component layers, and other factors may be arbitrarily chosen. The semiconductor layer growth technique is not limited to metalorganic chemical vapor deposition (MOCVD), and other techniques such as hydride vapor phase epitaxy (HVPE) and other liquid-phase epitaxy techniques may also be employed.

What is claimed is:

1. A Group III nitride semiconductor light-emitting device comprising:
   a first semiconductor layer having a first conduction type;
   a light-emitting layer disposed on the first semiconductor layer;
   a second semiconductor layer having a second conduction type, the layer being disposed on the light-emitting layer;
   a transparent electrode disposed on the second semiconductor layer;
   a first electrode electrically connected to the first semiconductor layer; and
   a second electrode electrically connected to the second semiconductor layer;
   wherein the Group III nitride semiconductor light-emitting device comprises an insulating multilayer film which intervenes between the second semiconductor layer and the transparent electrode, the insulating multilayer film comprising a first surface in contact with the second semiconductor layer and a second surface in contact with the transparent electrode;
   the insulating multilayer film serves as a distributed Bragg reflector and is formed in a region including a projection area obtained by projecting the second electrode to the second semiconductor layer;
   the insulating multilayer film comprises a first region and a second region, wherein the first region comprises a layer thickness greater than 95% of the maximum film thickness of the insulating multilayer film, and the second region comprises a layer thickness not greater than 95% of the maximum film thickness of the insulating multilayer film; and
   the second surface of the insulating multilayer film in the second region comprises a slope having a dent portion denting toward the first surface.

2. The Group III nitride semiconductor light-emitting device according to claim 1, wherein, in a cross-section which is orthogonal to the first surface and which includes the first region and the second region, the thickness of the insulating multilayer film, at a first point which is located on the second surface and which bisects the width of the second region, is 5% to 40% of the maximum film thickness of the insulating multilayer film.

3. The Group III nitride semiconductor light-emitting device according to claim 1, wherein, in a cross-section which is orthogonal to the first surface and which includes the first region and the second region, a second point at which the thickness of the insulating multilayer film is ½ the maximum film thickness is located in closer vicinity to the first region, as compared with the first point which is located on the second surface and which bisects the width of the second region.

4. The Group III nitride semiconductor light-emitting device according to claim 2, wherein, in a cross-section which is orthogonal to the first surface and which includes the first region and the second region, a second point at which the thickness of the insulating multilayer film is ½ the maximum film thickness is located in closer vicinity to the first region, as compared with the first point which is located on the second surface and which bisects the width of the second region.

5. The Group III nitride semiconductor light-emitting device according to claim 1, wherein, in a cross-section which is orthogonal to the first surface and which includes the first region and the second region, the angle $\theta 1$ of a first angle is larger than the angle $\theta 2$ of a second angle by $\geq 5°$, wherein the first angle is formed between a first line connecting the first point bisecting the width of the second region to a first end which is located on the second surface and which corresponds to 95% of the maximum film thickness and the first surface of the insulating multilayer film, and the second angle is formed between a second line connecting the first point and a second end located at the periphery of the insulating multilayer film and the first surface of the insulating multilayer film.

6. The Group III nitride semiconductor light-emitting device according to claim 2, wherein, in a cross-section which is orthogonal to the first surface and which includes the first region and the second region, the angle $\theta 1$ of a first angle is larger than the angle $\theta 2$ of a second angle by $\geq 5°$, wherein the first angle is formed between a first line connecting the first point bisecting the width of the second region to a first end which is located on the second surface and which corresponds to 95% of the maximum film thickness and the first surface of the insulating multilayer film, and the second angle is formed between a second line connecting the first point and a second end located at the periphery of the insulating multilayer film and the first surface of the insulating multilayer film.

7. The Group III nitride semiconductor light-emitting device according to claim 3, wherein, in a cross-section which is orthogonal to the first surface and which includes the first region and the second region, the angle $\theta 1$ of a first angle is larger than the angle $\theta 2$ of a second angle by $\geq 5°$, wherein the first angle is formed between a first line connecting the first point bisecting the width of the second region to a first end which is located on the second surface and which corresponds to 95% of the maximum film thickness and the first surface of the insulating multilayer film, and the second angle is formed between a second line connecting the first point and a second end located at the periphery of the insulating multilayer film and the first surface of the insulating multilayer film.

8. The Group III nitride semiconductor light-emitting device according to claim 4, wherein, in a cross-section which is orthogonal to the first surface and which includes the first region and the second region, the angle $\theta 1$ of a first angle is larger than the angle $\theta 2$ of a second angle by $\geq 5°$, wherein the first angle is formed between a first line connecting the first point bisecting the width of the second region to a first end which is located on the second surface and which corresponds to 95% of the maximum film thickness and the first surface of the insulating multilayer film, and the second angle is formed between a second line connecting the first point and a second end located at the periphery of the insulating multilayer film and the first surface of the insulating multilayer film.

9. The Group III nitride semiconductor light-emitting device according to claim 5, wherein the first angle $\theta 1$ is 15° to 45°.

10. The Group III nitride semiconductor light-emitting device according to claim 6, wherein the first angle $\theta 1$ is 15° to 45°.

11. The Group III nitride semiconductor light-emitting device according to claim 5, wherein the second angle $\theta 2$ is 3° to 30°.

12. The Group III nitride semiconductor light-emitting device according to claim 6, wherein the second angle θ2 is 3° to 30°.

13. The Group III nitride semiconductor light-emitting device according to claim 9, wherein the second angle θ2 is 3° to 30°.

14. The Group III nitride semiconductor light-emitting device according to claim 10, wherein the second angle θ2 is 3° to 30°.

15. The Group III nitride semiconductor light-emitting device according to claim 1, wherein the first end which is located on the second surface and which corresponds to 95% of the maximum film thickness is located inside the projection area at a distance of 3 μm or less from the end of the projection area, or outside the projection area at a distance of 7 μm or less from the end of the projection area.

16. The Group III nitride semiconductor light-emitting device according to claim 2, wherein the first end which is located on the second surface and which corresponds to 95% of the maximum film thickness is located inside the projection area at a distance of 3 μm or less from the end of the projection area, or outside the projection area at a distance of 7 μm or less from the end of the projection area.

17. The Group III nitride semiconductor light-emitting device according to claim 1, wherein, in a region outside the first point which bisects the width of the second region, the insulating multilayer film satisfies the following equation:

$$d < \lambda/(4 \cdot n)$$

(wherein d is a total thickness of insulating multilayer film, λ is a wavelength of light, and n is a refractive index of one layer of insulating multilayer film).

18. The Group III nitride semiconductor light-emitting device according to claim 2, wherein, in a region outside the first point which bisects the width of the second region, the insulating multilayer film satisfies the following equation:

$$d < \lambda/(4 \cdot n)$$

(wherein d is a total thickness of insulating multilayer film, λ is a wavelength of light, and n is a refractive index of one layer of insulating multilayer film).

19. A method for producing a Group III nitride semiconductor light-emitting device, the method comprising:
  forming a first semiconductor layer having a first conduction type;
  forming a light-emitting layer on the first semiconductor layer;
  forming a second semiconductor layer having a second conduction type on the light-emitting layer;
  forming an insulating multilayer film on a portion of the second semiconductor layer;
  forming a transparent electrode on the insulating multilayer film and the remaining portion of the second semiconductor layer;
  forming a first electrode on the first semiconductor layer; and
  forming a second electrode on the transparent electrode, wherein the insulating multilayer film formation step comprises the following:
  applying a resist;
  exposing to light a region other than an insulating multilayer film formation region;
  heating the resist;
  exposing the entirety of the resist;
  removing a portion which has not been exposed to light in the first exposure step, to thereby provide an end-widened hole;
  forming an insulating multilayer film inside the hole; and
  removing the resist.

* * * * *